US012620952B2

(12) United States Patent
Mawet

(10) Patent No.: US 12,620,952 B2
(45) Date of Patent: May 5, 2026

(54) DRIVE CIRCUIT FOR INDUCTIVE POSITION TRANSDUCER SYSTEM

(71) Applicant: Mitutoyo Corporation, Kanagawa-ken (JP)

(72) Inventor: Patrick H. Mawet, Snohomish, WA (US)

(73) Assignee: Mitutoyo Corporation, Kanagawa-ken (JP)

( * ) Notice: Subject to any disclaimer, the term of this patent is extended or adjusted under 35 U.S.C. 154(b) by 627 days.

(21) Appl. No.: 18/147,582

(22) Filed: Dec. 28, 2022

(65) Prior Publication Data

US 2024/0223141 A1 Jul. 4, 2024

(51) Int. Cl.
H03F 3/45 (2006.01)
H03F 1/26 (2006.01)
H03F 1/56 (2006.01)

(52) U.S. Cl.
CPC ........... H03F 3/45237 (2013.01); H03F 1/26 (2013.01); H03F 1/565 (2013.01); H03F 3/45273 (2013.01); *H03F 2200/372* (2013.01); *H03F 2200/513* (2013.01)

(58) Field of Classification Search
CPC ........ H03F 3/45237; H03F 1/26; H03F 1/565; H03F 3/45273; H03F 2200/372; H03F 2200/513; H03F 2203/45244; H03F 3/45179; G01D 5/204; G01D 5/20; H03M 1/12
USPC ................................................. 330/252–261
See application file for complete search history.

(56) References Cited

U.S. PATENT DOCUMENTS

| | | | |
|---|---|---|---|
| 4,651,405 A | 3/1987 | McMurtry | |
| 4,810,966 A | 3/1989 | Schmall | |
| 5,841,274 A | 11/1998 | Masreliez et al. | |
| 5,886,519 A | 3/1999 | Masreliez et al. | |
| 5,973,494 A | 10/1999 | Masreliez et al. | |
| 6,005,387 A | 12/1999 | Andermo et al. | |
| 6,011,389 A | 1/2000 | Masreliez et al. | |
| 6,043,644 A | 3/2000 | de Coulon et al. | |
| 6,525,530 B1 | 2/2003 | Jansson et al. | |
| 6,859,762 B2 | 2/2005 | Mawet | |
| 6,971,183 B2 | 12/2005 | Brenner et al. | |
| 7,282,995 B2 * | 10/2007 | Stephelbauer | H03F 3/189 |
| | | | 330/311 |

(Continued)

*Primary Examiner* — Khanh V Nguyen

(74) *Attorney, Agent, or Firm* — Seed Intellectual Property Law Group LLP

(57) ABSTRACT

An inductive position transducer system includes a drive circuit and an inductive position transducer with at least a first field generating coil. The drive circuit includes a resonant circuit portion and an amplifier portion. The amplifier portion comprises a current-driven single stage differential amplifier and is configured to provide an oscillating drive signal to the resonant circuit portion which results in a driving of the field generating coil (e.g., at a coil voltage which may be larger than a power supply voltage, such as over 2× larger). A controller may adjust a bias current that is provided to the amplifier portion to maintain the voltage across the field generating coil (e.g., at a specified voltage level). The amplifier portion may comprise CMOS transistors and may be fabricated on a chip (as part of a low-voltage CMOS integrated circuit) along with other portions of the inductive position transducer system.

25 Claims, 5 Drawing Sheets

(56)                    References Cited

U.S. PATENT DOCUMENTS

| | | | |
|---|---|---|---|
| 7,307,392 B2 | 12/2007 | Kang et al. | |
| 7,323,863 B2 | 1/2008 | Mawet | |
| 7,652,275 B2 | 1/2010 | Gladnick | |
| 8,438,746 B2 | 5/2013 | Usui | |
| 9,373,882 B2 * | 6/2016 | McFarthing | H04B 5/26 |
| 9,435,663 B2 | 9/2016 | Cook | |
| 9,772,202 B1 | 9/2017 | Cook | |
| 10,145,666 B2 | 12/2018 | Jansson | |
| 10,184,773 B2 | 1/2019 | Jansson | |
| 10,866,080 B2 | 12/2020 | Cook et al. | |
| 10,914,570 B2 | 2/2021 | Hamner et al. | |
| 2007/0176679 A1 * | 8/2007 | Kluge | H03F 3/45179 |
| | | | 330/253 |
| 2017/0176171 A1 | 6/2017 | Harsila et al. | |
| 2018/0156594 A1 | 6/2018 | Jansson | |
| 2020/0141714 A1 | 5/2020 | Cook et al. | |
| 2020/0141717 A1 | 5/2020 | Hamner et al. | |
| 2021/0116228 A1 | 4/2021 | Hamner | |
| 2021/0117020 A1 | 4/2021 | Hamner | |
| 2022/0205773 A1 | 6/2022 | Hamner et al. | |
| 2022/0205814 A1 | 6/2022 | Cook | |

* cited by examiner

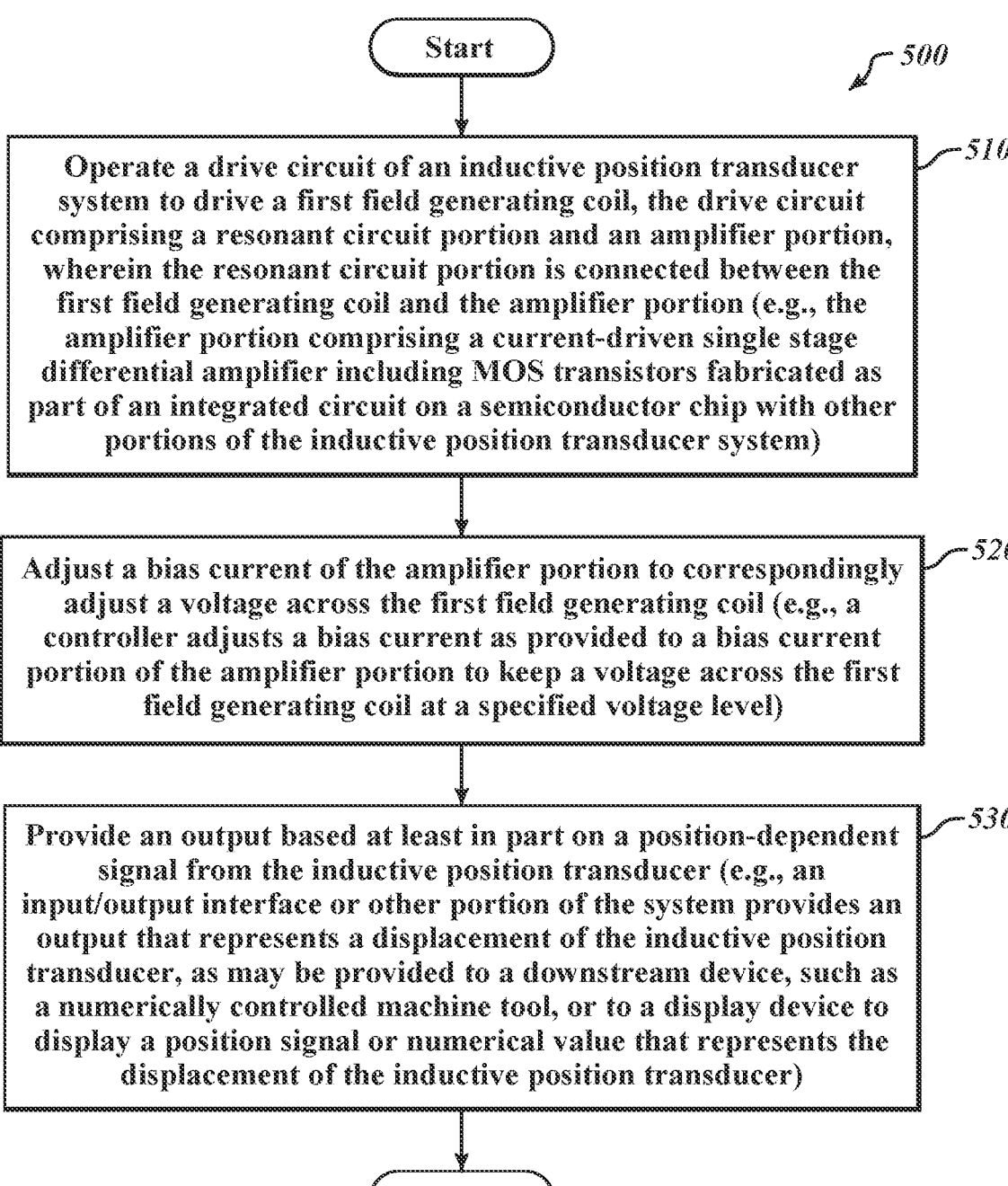

Start

*500*

Operate a drive circuit of an inductive position transducer system to drive a first field generating coil, the drive circuit comprising a resonant circuit portion and an amplifier portion, wherein the resonant circuit portion is connected between the first field generating coil and the amplifier portion (e.g., the amplifier portion comprising a current-driven single stage differential amplifier including MOS transistors fabricated as part of an integrated circuit on a semiconductor chip with other portions of the inductive position transducer system)

*510*

Adjust a bias current of the amplifier portion to correspondingly adjust a voltage across the first field generating coil (e.g., a controller adjusts a bias current as provided to a bias current portion of the amplifier portion to keep a voltage across the first field generating coil at a specified voltage level)

*520*

Provide an output based at least in part on a position-dependent signal from the inductive position transducer (e.g., an input/output interface or other portion of the system provides an output that represents a displacement of the inductive position transducer, as may be provided to a downstream device, such as a numerically controlled machine tool, or to a display device to display a position signal or numerical value that represents the displacement of the inductive position transducer)

*530*

End

*FIG.5*

DRIVE CIRCUIT FOR INDUCTIVE POSITION TRANSDUCER SYSTEM

BACKGROUND

Technical Field

This disclosure relates to metrology and, more particularly, to inductive position transducer systems.

Description of the Related Art

Inductive position transducers are widely used to measure relative displacements between one or more sensing elements (e.g., which may alternatively be referred to as receiver winding elements) and one or more disrupting elements (e.g., scale elements) that modulate the inductive coupling between the sensing elements and a field generating coil (e.g., which may alternatively be referred to as a transmitter winding). In various conventional inductive position transducers (e.g., such as those disclosed in U.S. Pat. Nos. 6,005,387 and 6,011,389, each of which is hereby incorporated herein by reference in its entirety), a lower power, intermittent drive circuit is used to supply a time-varying drive signal to the field generating coils. In the '389 and '387 patents, the intermittent drive circuit discharges a capacitor through the inductor formed by the field generating coil. This causes the field generating coil to "ring". That is, the current released by connecting the charged capacitor to ground through the inductor formed by the field generating coil and a serially-connected resistor oscillates and exponentially decays. While the field generating coil drive circuits disclosed in the '389 and '387 patents are suitable for inductive position transducers designed for certain operations, they may have certain limitations (e.g., in relation to speed, resolution, etc.).

In addition, for various previously known inductive position transducers, when an inductance of a drive coil does not participate in determining the oscillation frequency of the conventional drive circuits, the transducer signal output is detrimentally reduced to the extent that the oscillation frequency of the field generating coil does not coincide with the resonant frequency of the field generating coil.

A drive circuit with improved characteristics would be desirable.

BRIEF SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

An inductive position transducer system is provided which includes an inductive position transducer and a drive circuit. The inductive position transducer comprises at least a first field generating coil. The drive circuit is configured to drive the first field generating coil. The first field generating coil has a first coil terminal, a second coil terminal and a coil impedance. The drive circuit includes a resonant circuit portion and an amplifier portion.

The resonant circuit portion is connected to the first and second coil terminals. The resonant circuit portion comprises at least a first resonant circuit portion component, a second resonant circuit portion component, and a third resonant circuit portion component (e.g., wherein each resonant circuit portion component comprises a respective capacitor). The first resonant circuit portion component is coupled between a first resonant circuit portion node and a second resonant circuit portion node, the first resonant circuit portion node is separated from the first coil terminal by at least the second resonant circuit portion component, and the second resonant circuit portion node is separated from the second coil terminal by at least the third resonant circuit portion component.

The amplifier portion is connected to the first and second resonant circuit portion circuit nodes, the amplifier portion having an output impedance during operation. The amplifier portion is configured to provide an oscillating drive signal at the first and second resonant circuit portion nodes. The amplifier portion comprises a current-driven single stage differential amplifier. The differential amplifier comprises first and second amplifier inputs and first and second amplifier outputs, with the first amplifier output connected to the first resonant circuit portion node and the second amplifier output connected to the second resonant circuit portion node. A resonator portion comprising at least the resonant circuit portion and the first field generating coil has a resonant frequency and a load impedance presented to the amplifier portion during operation. In various implementations, a controller is configured to adjust a bias current that is provided to the amplifier portion to maintain the voltage across the first field generating coil at a specified voltage level. In various implementations, the amplifier portion includes MOS transistors and may be fabricated on a chip (e.g., along with other portions of the inductive position transducer system).

In various implementations, a method is provided for operating the inductive position transducer system. The method includes: operating the drive circuit (e.g., including the amplifier portion and the resonant circuit portion) to drive the first field generating coil; and providing an output based at least in part on a position-dependent signal from the inductive position transducer. In various implementations, the method may further include adjusting a bias current of the differential amplifier to correspondingly adjust the voltage across the first field generating coil.

BRIEF DESCRIPTION OF THE DRAWINGS

FIG. 5 is a flow diagram illustrating a method for operating an inductive position transducer system including a drive circuit as disclosed herein.

DETAILED DESCRIPTION

Figure 1:
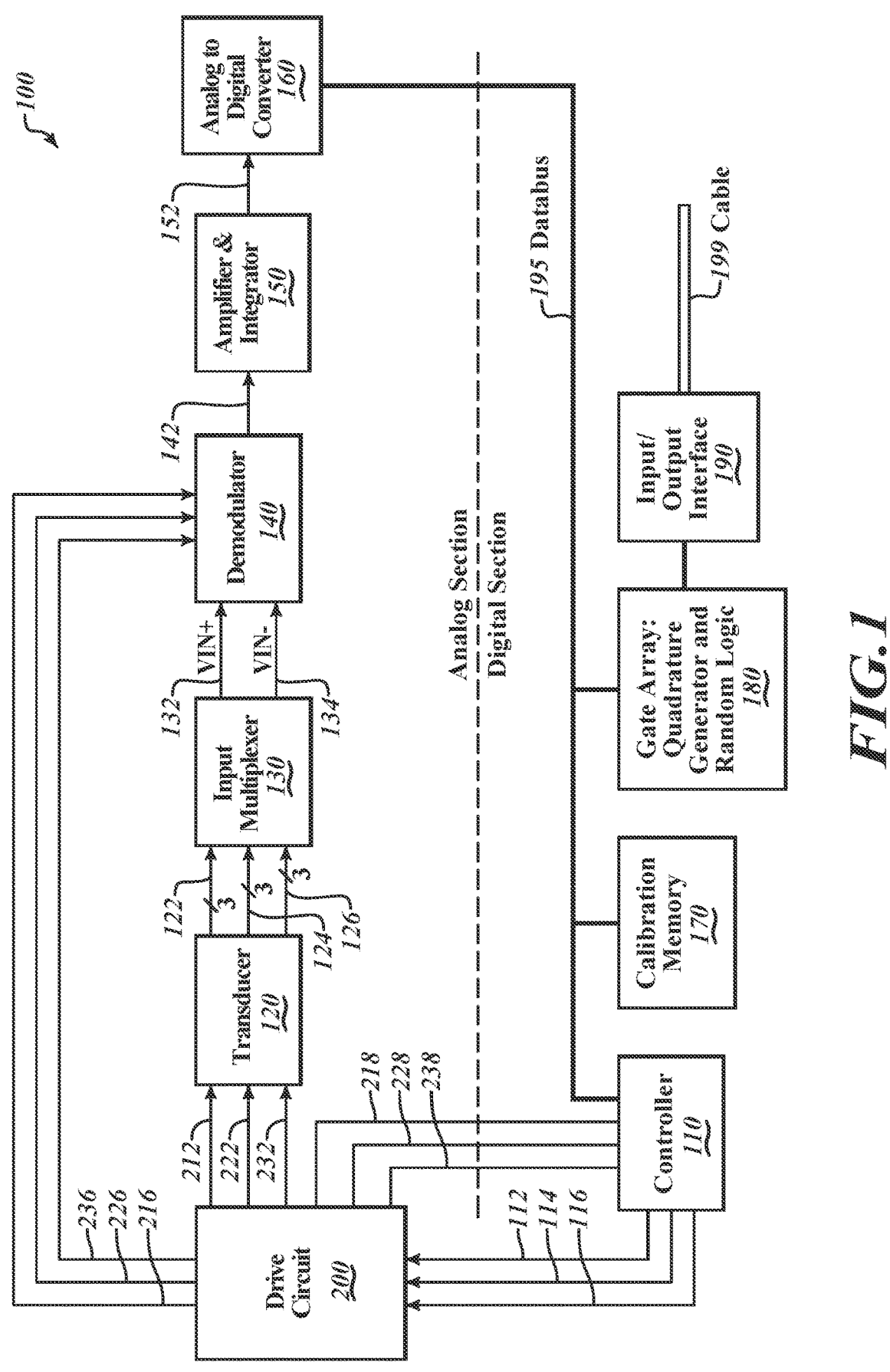
FIG. 1 is a block diagram of an implementation of an inductive position transducer system incorporating a drive circuit.

FIG. 1 is a block diagram of an implementation of an inductive position transducer system 100 including a drive circuit 200. As shown in FIG. 1, the inductive position transducer system 100 includes a controller 110 connected over signal lines 112, 114 and 116, and signal lines 218, 228 and 238, to a drive circuit 200. In the example of FIG. 1, the drive circuit 200 outputs drive signals for the field generating coils of a transducer 120 (e.g., an inductive position transducer) over signal lines 212, 222 and 232 for a three-scale transducer. In various implementations, the transducer 120 may be referenced as an inductive position sensing configuration or may be part of an inductive position sensing configuration. The transducer 120 outputs position-dependent signals from sensing elements (e.g., receiver windings) over the signal lines 122, 124 and 126 to an input multiplexer 130. In particular, if the transducer 120 uses a three-phase sensing element configuration, each of the signal lines 122, 124 and 126 will comprise three separate signal lines.

In this exemplary embodiment, the drive circuit 200 may (e.g., in general or during certain measurement modes/states) continuously drive one or more of the different field generating coils in the transducer 120, based on the signals output over the signal lines 112, 114 and 116. The input multiplexer 130 selectively passes the position-dependent sensing signals on the signal lines 122, 124 and 126 to a synchronous demodulator 140 over the signal lines 132 and 134. The synchronous demodulator 140 also inputs synchronous demodulation control signals over the signal lines 216, 226 and 236 from the drive circuit 200. The synchronous demodulator 140 synchronously demodulates the position-dependent sensing signals generated by the transducer 120 and output through the input multiplexer 130 and outputs the synchronously demodulated signal over the signal line 142 to an amplifier and integrator 150.

The amplifier and integrator 150 amplifies the synchronously demodulated signal received over the signal line 142 and integrates the amplified signal to improve the signal-to-noise ratio, thereby increasing the attainable resolution, and outputs the amplified and integrated signal over the signal line 152 to the analog/digital converter 160. The analog/digital converter 160 converts the analog amplified and integrated signal received over a signal line 152 to a digital signal that can be used by the controller 110 and/or stored in a memory portion of the controller 110 and/or the calibration memory 170. In particular, the analog/digital converter 160 outputs the digital data signal over a digital databus 195.

Each of the controller 110, the calibration memory 170 and a gate array 180 are connected to the digital databus 195. The gate array 180 is usable to convert the sensing signals (e.g., three-phase sensing signals) output by the transducer 120 (e.g., into two-phase, quadrature signals, etc.) usable by such devices as numerically controlled machine tools and the like. The gate array 180 can also incorporate any additional digital logic that is necessary or desirable to include in the inductive position transducer system 100.

The gate array 180 is connected to an input/output interface 190. In various implementations, the input/output interface 190 may be connected to a cable 199 that may be connectable to a downstream device (e.g., a numerically controlled machine tool, etc.). Alternatively, the input/output interface 190 and/or the cable 199 can be connected to a display device to display a position signal or numerical value derived by the controller 110 and/or the gate array 180 from the digital data signal output by the analog/digital converter 160 (e.g., that represents the displacement between one or more disruptor elements (e.g., scale elements) of the position transducer 120 and the sensing elements (e.g., readhead elements) of the position transducer 120).

In various implementations, the one or more disruptor elements (e.g. scale elements, etc.) of the transducer 120 may be coupled to a first element (e.g., a first part of a numerically controlled machine tool, a first part of a measurement instrument for measuring dimensions of an object/workpiece, a first part of a measurement probe, etc.) and the sensing elements of the transducer may be coupled to a second element (e.g., a second part of the numerically controlled machine tool, a second part of the measurement instrument for measuring dimensions of an object/workpiece, a second part of the measurement probe, etc.), for which the first and second elements may be movable relative to one another. As indicated above, a displacement between the one or more disruptor elements (e.g., scale elements) and the sensing elements of the position transducer 120, may be indicated by the digital data signal output by the analog/digital converter 160, which may correspond to a determined position measurement of the inductive position transducer system 100 (e.g., as determined during measurement operations of the inductive position transducer system 100).

In general, various aspects of the overall operations and/or drive circuits of an inductive position transducer system 100 (e.g., as including one or more disruptor elements (e.g., scale elements) and sensing elements (e.g., readhead elements) which are displaced relative to one another as part of measurement operations) are described in more detail in the incorporated '387 and '389 patents, as well as in U.S. Pat. Nos. 5,973,494; 5,886,519; 6,525,530; 10,866,080; and 10,914,570, each of which is incorporated herein by reference in its entirety.

Figure 2:
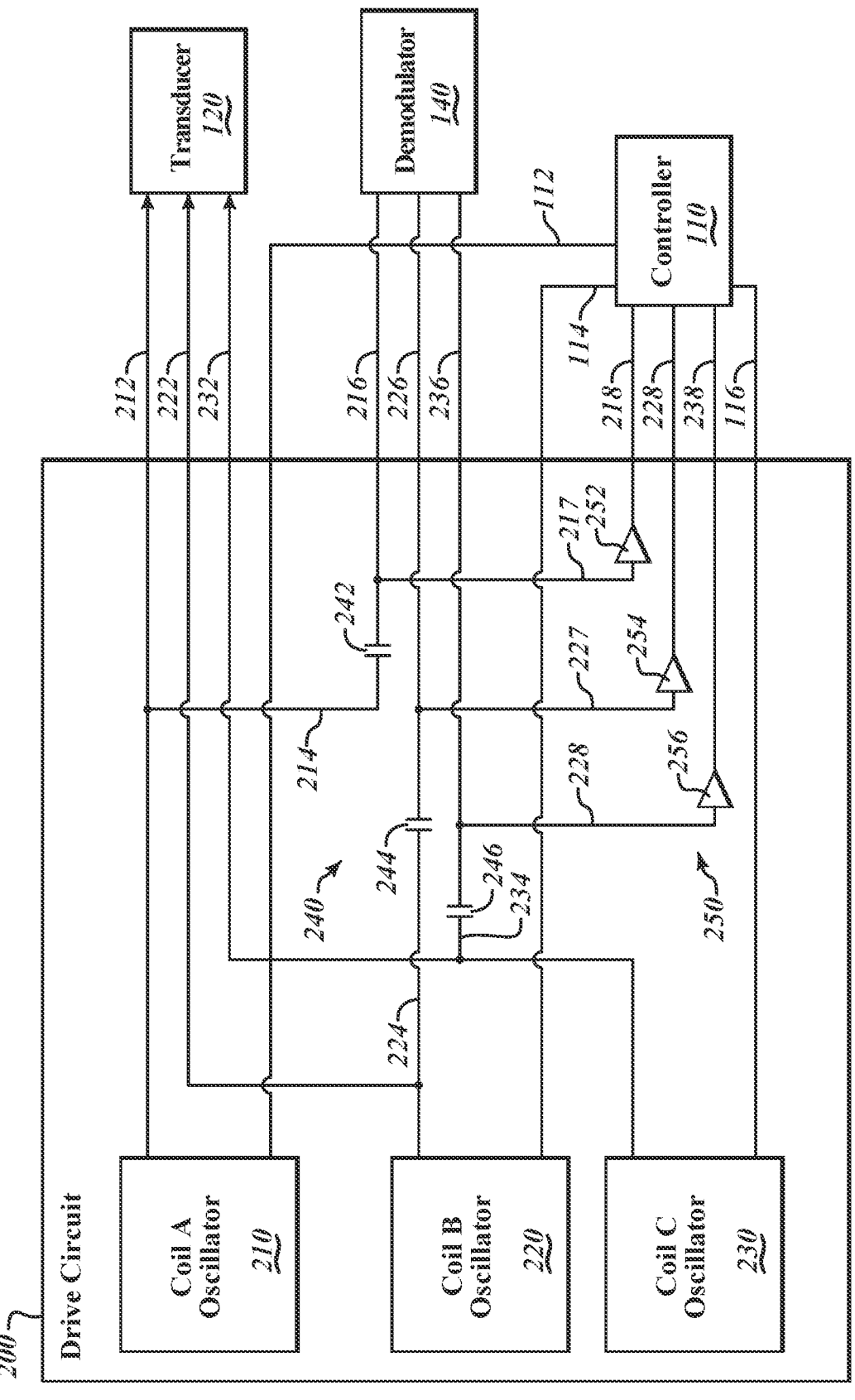
FIG. 2 is a block and schematic diagram showing in greater detail an implementation of the drive circuit of FIG. 1 as including field generating coil oscillators as coupled to field generating coils of a transducer.

FIG. 2 is a block and schematic diagram showing in greater detail an implementation of the drive circuit 200 of FIG. 1 as including field generating coil oscillators as coupled to field generating coils of a transducer. In various implementations, each of the field generating coil oscillators may be representative of a drive circuit for driving the associated field generating coil. As shown in FIG. 2, for an example implementation with a three-scale transducer 120, the drive circuit 200 includes a field generating coil A oscillator 210, a field generating coil B oscillator 220 and a field generating coil C oscillator 230, each respectively connected to the first, second and third field generating coils A-C of the transducer 20.

In particular, as shown in FIG. 2, the drive signal output by the field generating coil A oscillator 210 is output over the signal line 212 to the first field generating coil A of the transducer 120. Similarly, the drive signal output by the field generating coil B oscillator 220 is output over the signal line 222 to the second field generating coil B of the transducer 120. Finally, the drive signal output by the field generating coil C oscillator 230 is output over the signal line 232 to the third field generating coil C of the transducer 120.

The controller 110 outputs signals (e.g., bias current signals) to the drive circuit 200 to enable and/or otherwise control the three field generating coil oscillators 210, 220 and 230. In particular, the controller 110 outputs a first signal over the signal line 112 to the field generating coil A oscillator 210. Similarly, the controller 110 outputs a second signal over the signal line 114 to the field generating coil B oscillator 220. Likewise, the controller 110 outputs a third signal over the signal line 116 to the field generating coil C oscillator 230. The operation of these signals will be described in greater detail below.

As further shown in the example implementation of FIG. 2, the drive circuit 200 includes a capacitor portion 240 and a buffer portion 250. The capacitor portion 240 includes a first capacitor 242, a second capacitor 244 and a third capacitor 246, associated, respectively, with the field generating coil oscillators 210-230. In particular, a signal line 214 connected to the signal line 212 is connected to a first terminal of the first capacitor 242. The second terminal of the first capacitor 242 is connected to the signal line 216, which is connected to the synchronous demodulator 140. Similarly, a first terminal of the second capacitor 244 is connected by a signal line 224 to the signal line 222. The other terminal of the second capacitor 244 is connected to the signal line 226, which is connected to the synchronous demodulator 140. Finally, a first terminal of the third capacitor 246 is connected by a signal line 234 to the signal line 232 from the field generating coil C oscillator 230. The second terminal of the third capacitor 246 is connected to the signal line 236, which is connected to the synchronous demodulator 140, as indicated above.

As further shown in FIG. 2, the buffer portion 250 includes a first buffer 252, a second buffer 254 and a third buffer 256. An input terminal of the first buffer 252 is connected by a signal line 217 to the signal line 216 of the field generating coil A oscillator 210. The output terminal of the first buffer 252 is connected to the signal line 218, which, as indicated above, is connected to the controller 110. Likewise, the input terminal of the second buffer 254 is connected by a signal line 227 to the signal line 226 of the field generating coil B oscillator 220. The output terminal of the second buffer 254 is connected to the signal line 228, which is connected to the controller 110. Finally, the input terminal of the third buffer 256 is connected to a signal line 237, which is connected to the signal line 236. The output terminal of the third buffer 256 is connected to the signal line 238, which is connected to the controller 110. The capacitors 242, 244, and 246 block DC voltages imposed on the signal lines 216, 226, and 236 by the demodulator 140. The first-third buffers 252 256 convert the sinusoidal signals on the signal lines 216, 226, and 236 to square-waves on the signal lines 218, 228, and 238.

As will be described in more detail below with respect to FIGS. 3-5, in various implementations it is desirable to produce a relatively high voltage across a field generating coil (e.g., field generating coil A as described above) of an inductive position transducer system (e.g., which in various implementations may correspond to a linear scale configuration, a rotary scale configuration, a three-dimensional sensor configuration, etc.). More specifically, in such inductive position transducer systems, a field generating coil is utilized to excite an alternating current (AC) magnetic field (e.g., a changing magnetic flux), which is affected by one or more disruptor elements (e.g., scale elements, in which associated currents may be induced by the changing magnetic field/flux). The changing magnetic field (i.e., as affected by the one or more disruptor elements) is sensed by sensing elements (e.g., receiver coils). The signals as sensed by the sensing elements indicate a position of the one or more disruptor elements (e.g., scale elements) in relation to the sensing elements (e.g., and may thus be referenced a position signals, which vary depending on the relative position). These position signals are typically added together in several electronic channels (e.g., as illustrated in FIG. 1). A calculation is done on the position signals (e.g., on the magnitude of the position signals) to determine the relative position, to enable a precise measurement.

In general, in such systems, it is desirable for a relatively strong magnetic field (e.g., changing magnetic flux) to be produced (e.g., to achieve strong signals in the sensing elements, so as to be significantly larger than, and correspondingly overcome, circuit noise, etc.). Accordingly, it is generally desirable to produce a relatively high voltage across a corresponding field generating coil (e.g., which results in a strong magnetic field/changing magnetic flux). In various implementations of such inductive position transducer systems, it may also generally be desirable for temperatures to remain relatively constant (e.g., for which temperature fluctuations may otherwise affect the sensing signals in different ways), for which it may be desirable for the electronic components to dissipate relatively low power when possible. In general for low power requirements in such systems, it may be desirable for the electronic power supply voltage to be at a relatively low voltage level, while as noted above it may simultaneously be desirable for the voltage produced across a field generating coil of the system to be at a relatively high voltage level. As will be described in more detail below, such characteristics may be achieved in an inductive position transducer system utilizing a drive circuit as disclosed herein.

Figure 3:
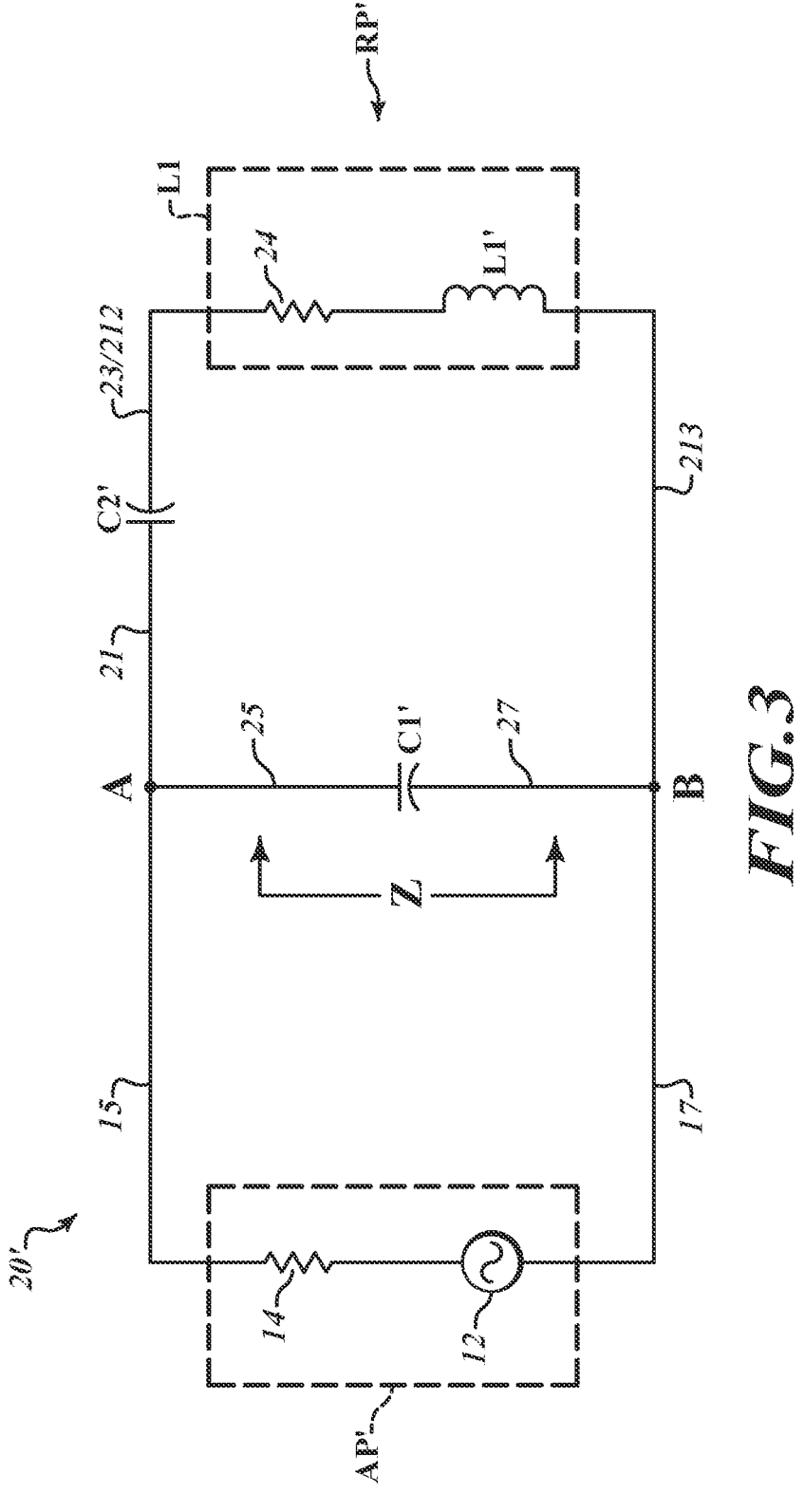
FIG. 3 is a schematic diagram of an implementation of a resonant circuit portion as illustrating certain circuit principles.

FIG. 3 is a schematic diagram of an implementation of a resonant circuit portion of a drive circuit as illustrating certain circuit principles (e.g., of a field generating coil oscillator as will be described in more detail below). In the field generating coil oscillators as described and illustrated herein, in various implementations the voltage across the field generating coil is increased, and is ideally maximized. It will be appreciated that there may always be some distributed stray resistance in the field generating coil. In view of this stray resistance, to increase, and ideally maximize, the voltage across the field generating coil, the power dissipated in this stray resistance may be increased, and ideally maximized.

To increase, and ideally maximize, the power dissipated in the stray resistance, it may be desirable for the impedance of the load to approach, and possibly match, the impedance of the output of the drive circuit. This relies on the well-known circuit principles that impedance matching maximizes the power delivered to the load. For the field generating coils of the inductive position transducers being driven using the circuit principles as described herein, matching the load impedance, or at least approaching the impedance of the load, in various exemplary embodiments, is desirably accomplished by at least approaching canceling the reactance of the field generating coil and by incorporating the stray resistance into a desired load resistance. As described herein, this is accomplished using a circuit that combines features of both series and parallel resonant circuits. FIG. 3 illustrates such a combined series and parallel resonant circuit, as included in an impedance transformer 20'.

As shown in FIG. 3, the field generating coil L1 may represent an individual one of the field generating coils of the transducer 120 shown in FIG. 2 (e.g., representative of the field generating coil A). In particular, the inductance L of the field generating coil L1 may correspond to the inductance of the field generating coil A in the transducer 120. The impedance transformer 20', having an impedance Z, comprises a first capacitor C1', a second capacitor C2', and a field generating coil L1 (e.g., including a resistive portion 24 and an inductive portion L1'). Furthermore, as shown in FIG. 3, an amplifier portion AP' (e.g., including an amplifier as part of a signal generator portion 12 and a resistor portion 14) is connected by a signal line 15 to a first node, the input node A.

The input node A is connected by a signal line 21 to the capacitor C2'. A signal line 25 connects the input node A to the capacitor C1'. A signal line 23 connects the capacitor C2' to the field generating coil L1 (e.g., which includes the resistive portion 24 and the inductive portion L1'). In various implementations, the signal line 23 may correspond to, or may be coupled to, a signal line 212 (e.g., as representing a connection from a drive circuit to the field generating coil L1 of the transducer). A signal line 213 connects the field generating coil L1 to a node B. A signal line 17 connects the node B to the signal generator 12. A signal line 27 connects the capacitor C1' to the node B.

Thus, as shown in FIG. 3, the capacitor C2', the resistive portion 24 and the inductive portion L1' of the field generating coil L1 form a series RCL circuit between the nodes A and B. Furthermore, the capacitor C1' is connected in parallel with this RCL series circuit between the nodes A and B. As noted above, the resistive portion 24 is the stray resistance in the loop formed by the field generating coil L1. The capacitor C2' is thus the series capacitor, while the capacitor C1' is the parallel capacitor.

The combined input impedance Z of the capacitors C1' and C2', the resistive portion 24 and the inductive portion L1' of the field generating coil L1 is the load on the amplifier portion AP'. In various implementations, the resistive portion 14 is the output resistance of the signal generator 12 to which the input impedance Z of the impedance transformer 20' is matched. In particular, by choosing the capacitances $C_1$ and $C_2$ of the capacitors C1' and C2' appropriately, the impedance Z may approach (e.g., may be approximately equal to) the resistance $R_s$ of the resistive portion 14 of the signal generator 12.

It should be appreciated that, in the impedance transformer 20', the topology of the impedance transformer 20' is determined by the relative values of the resistance of the resistive portion 24 and the resistance of the source resistive portion 14. In various implementations, if the resistance of the resistive portion 24 is less than the resistance of the source resistive portion 14, the first element to the "left" of the load may be a series element. The parallel element then follows. Of course, if the relationship was reversed, such that the resistance of the resistive portion 24 is greater than the resistance of the source resistive portion 14, the first element to the "left" of the load may be the parallel element. In this case, the series element would then follow.

It should further be appreciated that the series and parallel elements forming the input impedance Z are not necessarily capacitors. That is, in some exemplary embodiments, the series and parallel elements can be inductors. However, in many cases, in the drive circuit 200 according to this invention for driving the field generating coil L1, capacitors may be used as the series and parallel circuit elements.

Figure 4:
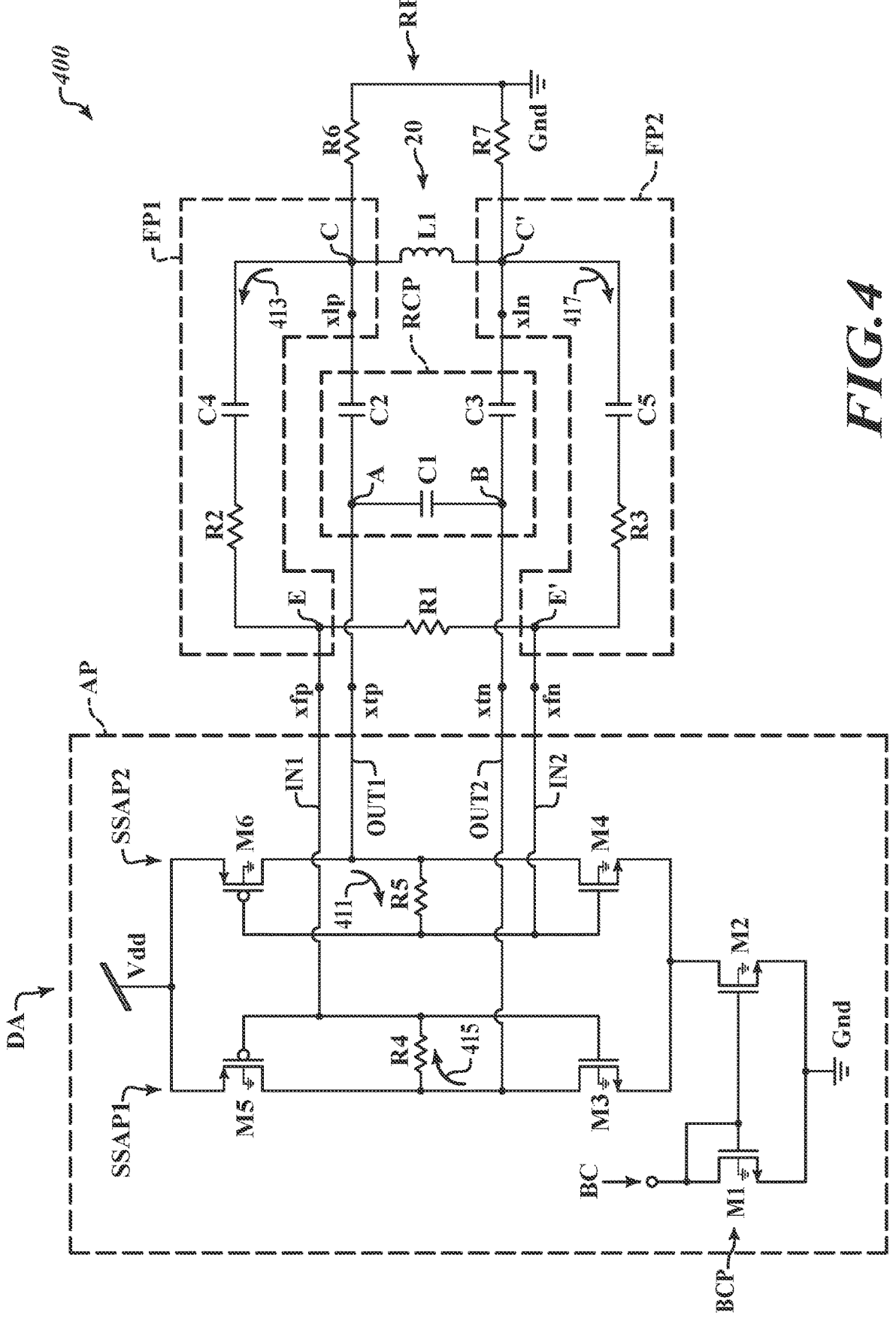
FIG. 4 is a schematic diagram of an implementation of a field generating coil oscillator of a drive circuit and an associated field generating coil of FIG. 2.

FIG. 4 is a schematic diagram of an implementation of a field generating coil oscillator (i.e., of a drive circuit) and an associated field generating coil L1. In the example of FIG. 4, the field generating coil L1 may represent an individual one of the field generating coils of the transducer 120 shown in FIG. 2 (e.g., representative of the field generating coil A). In certain implementations, the drive circuit 400 shown in FIG. 4 may be characterized as a double-ended oscillator (e.g., as the oscillator 210 of FIG. 2 as part of the drive circuit 200). As indicated, in various implementations the drive circuit 200 of FIG. 2 may include the drive circuit 400 of FIG. 4, as well as additional drive circuits (e.g., for driving the other field generating coils of the transducer 120). As will be described in more detail below, the drive circuit 400 includes various capacitors and resistors (e.g., capacitors C1, C2, C3, C4 and C5, and resistors R1, R2, R3, R4, R5, R6 and R7), each of which will be understood to have respective first and second terminals, which are utilized for respective connections (e.g., a resistor or capacitor that is coupled between first and second elements will be understood to have a respective terminal coupled to each element).

The drive circuit 400 is configured to drive the first field generating coil L1, which has first and second coil terminals xlp and xln, and a coil impedance. As will be described in more detail below, the drive circuit 400 includes at least a resonant circuit portion RCP and an amplifier portion AP. Briefly, the resonant circuit portion RCP is connected to the first and second coil terminals xlp and xln, and includes at least a first resonant circuit portion component (e.g., capacitor C1), a second resonant circuit portion component (e.g., capacitor C2), and a third resonant circuit portion component (e.g., capacitor C3).

The first resonant circuit portion component (e.g., capacitor C1) is coupled between a first resonant circuit portion node (e.g., node A) and a second resonant circuit portion node (e.g., node B). The first resonant circuit portion node (e.g., node A) is separated from the first coil terminal (e.g., xlp) by at least the second resonant circuit portion component (e.g., capacitor C2). The second resonant circuit portion node (e.g., node B) is separated from the second coil terminal (e.g., xln) by at least the third resonant circuit portion component (e.g., capacitor C3). The amplifier portion AP is connected to the first and second resonant circuit portion circuit nodes (e.g., nodes A and B), and has an output impedance during operation. The amplifier portion AP is configured to provide an oscillating drive signal at the first and second resonant circuit portion nodes (nodes A and B). The resonant circuit portion RCP, amplifier portion AP, and the various associated connections will each be described in more detail below.

As shown in FIG. 4, the amplifier portion AP includes a current-driven single stage differential amplifier DA. The differential amplifier DA comprises a first input terminal xfp (e.g., corresponding to a first amplifier input IN1), a second input terminal xfn (e.g., corresponding to a second amplifier input IN2), a first output terminal xtp (e.g., corresponding to a first amplifier output OUT1), and a second output terminal xtn (e.g., corresponding to a second amplifier output OUT2). A circuit path 411 is connected between the first output terminal xtp and the second input terminal xfn of the differential amplifier DA. Similarly, a circuit path 415 is connected between the second output terminal xtn and the first input terminal xfp of the differential amplifier DA. A circuit path 413 is connected between the first output terminal xtp and the first input terminal xfp of the differential amplifier DA. Likewise, a circuit path 417 is connected between the second output terminal xtn and the second input terminal xfn of the differential amplifier DA. In various implementations, the circuit paths 413 and 417 may be characterized as feedback loops. The circuit elements forming these circuit paths will be discussed in more detail below.

As will be described in more detail below, in operation the voltage (e.g., the amplitude of the oscillating voltage) across the field generating coil L1 may be adjusted by adjusting the bias current as provided to the differential amplifier DA (e.g., as provided/adjusted by the controller 110). In various implementations, the utilization of the differential amplifier DA and the impedance transformer 20 enables high coil voltages (e.g., higher than the power supply voltage Vdd, and in some implementations at least 2× or 3× higher than the power supply voltage Vdd) to be achieved. As utilized herein, the terms "voltage", "voltage level", "specified voltage level" may in various instances refer to the amplitude of the corresponding oscillating/varying voltage (e.g., as occurring across the field generating coil L1, etc.). This may be contrasted with a voltage such as that of a power supply voltage Vdd (e.g., which may be a DC voltage) which may not be intended to oscillate/vary.

In FIG. 4, the impedance transformer portion 20 is included in the drive circuit 400. A resonator portion RP includes at least the field generating coil L1 and the impedance transformer portion 20 which comprises the resonant circuit portion RCP which comprises the first capacitor C1, the second capacitor C2, and the third capacitor C3. The three capacitors (i.e., C1, C2 and C3) are used to make the circuit fully differential. With respect to the first output terminal xtp of the differential amplifier DA (i.e., which is connected to the input node A), the capacitor C2, the field generating coil L1 and the capacitor C3 are connected in series between the input nodes A and B, while the capacitor C1 is connected in parallel with the series-connected capacitor C2, the field generating coil L1, and the capacitor C3 between the input nodes A and B. With respect to the second output terminal xtn of the differential amplifier DA (i.e., which is connected to the input node B), the capacitor C3, the field generating coil L1 and the capacitor C2 are connected in series between the input nodes B and A, while the capacitor C1 is connected in parallel with the series-connected capacitor C3, the field generating coil L1, and the capacitor C2 between the input nodes B and A. As noted above, the capacitors C1-C3 along with the field generating coil L1 create at least part of the resonator portion RP (e.g., in accordance with the capacitance of the capacitors and the inductance of the field generating coil). In various implementations, the resonator portion RP may also include other elements and/or portions (e.g., such as first and second filter portions FP1 and FP2, etc.).

A resistor R6 is connected between a first terminal xlp of the field generating coil L1 and ground, and a resistor R7 is coupled between a second terminal xln of the field generating coil L1 and ground. The first terminal xlp is connected to a node C and the second terminal xln is connected to a node C'. The resistors R6 and R7 provide a direct current (DC) path to ground for the terminals xlp and xln. In various implementations, this configuration may thus prevent the terminals xlp and xln from floating (e.g., from having no connection to ground for which the voltages at the terminals may otherwise vary in accordance with charge accumulation, etc.).

The circuit path 411 includes a bias resistor R5 that is connected between the first output terminal xtp and the second input terminal xfn (i.e., and is thus connected between the nodes A and E', such as with a first terminal connected to the input node A/terminal xtp and a second terminal connected to the node E'/terminal xfn). The circuit path 415 includes a bias resistor R4 that is connected between the second output terminal xtn and the first input terminal xfp (i.e., and is thus connected between the nodes B and E, such as with a first terminal connected to the input node B/terminal xtn and a second terminal connected to the node E/terminal xfp). The bias resistors R4 and R5 provide direct current (DC) bias for first and second complementary single stage amplifier portions SSAP1 and SSAP2, respectively, of the differential amplifier DA. Accordingly, the resistance values of resistors R4 and R5 may be configured to provide correct bias levels for the differential amplifier DA.

It will be appreciated that during operation of the drive circuit 400, in accordance with the oscillation (e.g., in accordance with the operation of the LC circuit of the resonator portion including the field generating coil L1 and the resonant circuit portion RCP), the relative effect of certain resistors (e.g., the resistors R4 and R5) may decrease as the oscillation increases (e.g., to where the effect of the resistors R4 and R5 may become relatively negligible). In various implementations, it may be desirable for the resistors R4-R7 to have relatively high values (e.g., significantly higher than the impedance of the resonator portion) so they do not have a significant influence on the resonator portion loop gain.

With respect to the circuit path 413 (e.g., which in certain implementations may be characterized as a feedback loop), the capacitor C4 and the resistor R2 are part of a first filter portion FP1 and are coupled in series between the node C and the node E (i.e., and are thus coupled in series between the first terminal xlp of the field generating coil L1 and the first input terminal xfp/first amplifier input IN1 of the differential amplifier DA). In various implementations, the capacitor C4 and resistor R2 may be referenced as a first filter portion capacitor C4 and a first filter portion resistor R2, each with respective first and second terminals for making the respective connections as described herein. The node C may be referenced as a first filter portion first node C and the node E may be referenced as a first filter portion second node E. More specifically, the first filter portion capacitor C4 may have a respective first terminal connected to the first coil terminal xlp/first filter portion first node C, and a respective second terminal connected to a first terminal of the first filter portion resistor R2. The second terminal of the first filter portion resistor R2 may be connected to the first amplifier input IN1/terminal xfp/first filter portion second node E.

Similarly, with respect to the circuit path 417 (e.g., which in certain implementations may be characterized as a feedback loop), the capacitor C5 and the resistor R3 are part of a second filter portion FP2 and are coupled in series between the node C' and a node E' (i.e., and are thus coupled in series between the second terminal xln of the field generating coil L1 and the second input terminal xfn/second amplifier input IN2 of the differential amplifier DA). In various implementations, the capacitor C5 and resistor R3 may be referenced as a second filter portion capacitor C5 and a second filter portion resistor R3, each with respective first and second terminals for making the respective connections as described herein. The node C' may be referenced as a second filter portion first node C' and the node E' may be referenced as a second filter portion second node E'. More specifically, the second filter portion capacitor C5 may have a respective first terminal connected to the second coil terminal xln/second filter portion first node C', and a respective second terminal connected to a first terminal of the second filter portion resistor R3. The second terminal of the second filter portion resistor R3 may be connected to the second amplifier input IN2/terminal xfn/second filter portion second node E'.

In various implementations, the resistor R2 and capacitor C4 in series, and the resistor R3 and capacitor C5 in series, create a high pass filter configuration (e.g., as part of a feedback loop configuration) which may be tuned to compensate for phase shift in the differential amplifier DA. In various implementations, in order for a desired oscillation to occur, it is desirable for the feedback loop configuration to generally be in phase with the coil voltage of the field generating coil L1 with a gain greater than 1. In various implementations, the first filter portion FP1 (e.g., including the capacitor C4 and the resistor R2) and the second filter portion FP2 (e.g., including the capacitor C5 and the resistor R3) may also or alternatively be characterized as a first phase shifter portion and a second phase shifter portion, respectively. In various implementations, the capacitors C4 and C5 may be variable capacitors (e.g., which may enable additional tuning in relation to the associated functions).

The resistor R1 is coupled between the node E and the node E' (i.e., and is thus connected between the first input terminal xfp and the second input terminal xfn). A resistor R2 is coupled between the node E and the capacitor C4 (i.e., and is thus connected between the first input terminal xfp and the capacitor C4). The resistor R3 is connected between the node E' and the capacitor C5 (i.e., and is thus connected between the second input terminal xfn and the capacitor C5). In various implementations, the resistors R1-R3 form a resistor divider, which may be utilized to feed the coil voltage of the field generating coil L1 back to the differential amplifier DA (e.g., as part of the integrated circuit). The resistor divider may be utilized to ensure that feedback signals do not exceed the power supply voltage Vdd (e.g., of the integrated circuit and which supplies the differential amplifier DA). Thus, the resistors R2 and R3 may be characterized as being utilized for both a resistor divider function, and a phase shifting function (e.g., as described above with respect to the filter portions FP1 and FP2).

In various implementations, the current driven single stage differential amplifier DA comprises a first single stage amplifier portion SSAP1 and a second single stage amplifier portion SSAP2 (e.g., which may each be a complimentary amplifier portion comprising metal-oxide-semiconductor (MOS) transistors). In the example implementation illustrated in FIG. 4, the first single stage amplifier portion SSAP1 comprises a first n-channel MOS (NMOS) transistor M3 coupled in series with a first p-channel MOS (PMOS) transistor M5. The gates of the transistors M3 and M5 are coupled together to form the first input terminal xfp and as providing the first amplifier input IN1, and the drains of the transistors M3 and M5 are coupled together to form the second output terminal xtn and as providing the second amplifier output OUT2. The resistor R4 is thus coupled between the connected drains and the connected gates of the transistors M3 and M5.

The second single stage amplifier portion SSAP2 comprises a second NMOS transistor M4 coupled in series with a second PMOS transistor M6. The gates of the transistors M4 and M6 are coupled together to form the second input terminal xfn and as providing the second amplifier input IN2, and the drains of the transistors M4 and M6 are coupled together to form the first output terminal xtp and as providing the first amplifier output OUT1. The resistor R5 is thus coupled between the connected drains and the connected gates of the transistors M4 and M6. In various implementations, in operation the voltages of the outputs OUT1 and OUT2 of the differential amplifier DA may swing in opposite directions from each other.

The sources of the transistors M5 and M6 are coupled together, and are coupled to a power supply voltage Vdd (e.g., as may be the power supply voltage for the differential amplifier DA and in general for the integrated circuit that may include the differential amplifier, as well as other portions of the system, such as at least some of the portions 110-190 of the system 100 as illustrated in FIG. 1). The sources of the transistors M3 and M4 are coupled together, and are coupled to a bias current portion BCP (e.g., are coupled to the drain of the NMOS transistor M2 of the bias current portion BCP, as will be described in more detail below).

In various implementations, the amplifier portion AP comprises the bias current portion BCP, which receives a bias current from a controller (e.g., controller 110 of FIG. 1). In various implementations, the controller is configured to provide the bias current (e.g., over a signal line 112) to the amplifier portion AP to keep a voltage across the first field generating coil L1 at a specified voltage level. For example, if during measurement operations the system is intended to be operated with the voltage across the field generating coil L1 at a specified level (e.g., 10 volts, 12 volts, etc.) the bias current may be provided from the controller to the amplifier portion AP during measurement operations to keep the voltage across the field generating coil L1 at that specified level.

In the example implementation illustrated in FIG. 4, the bias current portion BCP comprises two MOS transistors (i.e., including a first NMOS transistor M1 and a second NMOS transistor M2). The sources of the transistors M1 and M2 are coupled together, and are coupled to ground. As noted above, the drain of the NMOS transistor M2 is coupled to the connected sources of the transistors M3 and M4. The gates of the transistors M1 and M2 are coupled together, and are coupled to the drain of the transistor M1, which receives the bias current (e.g., as provided through the signal line 112 from the controller 110). The transistors M1 and M2 may thus form a current mirror. In various implementations, the transistor M2 may be larger than the transistor M1 (e.g., as may function to amplify the bias current from the controller for providing the current to the current-driven differential amplifier DA).

In various implementations, the controller may be configured to adjust the bias current that is provided to the amplifier portion to maintain the voltage across the first field generating coil at a specified voltage level. For example, at a first time (e.g., under certain first operating conditions, including at a first operating temperature, etc.), the controller may configured to provide the bias current at a first bias current level which results in a voltage across the field generating coil that is at the specified voltage level (e.g., 10 volts). Then, at a second time (e.g., under certain second operating conditions, including at a second operating temperature, etc.), the controller providing the bias current at the first bias current level may result in a voltage across the field generating coil that is not at the specified voltage level. For example, due to the change in operating conditions between the first time and the second time (e.g., with a change from the first operating temperature to the second operating temperature, which may affect the resistance, etc. of certain components), the first bias current may result in a voltage (e.g., 9.5 volts) across the field generating coil that is different than the specified voltage level (e.g., 10 volts). In response (e.g., in response to a measured parameter as received by the controller that indicates or otherwise corresponds to the voltage across the field generating coil), the controller may be configured to adjust the bias current (e.g., to increase the bias current) from the first bias current level to a second bias current level which results in a voltage across the field generating coil that is at the specified voltage level (e.g., 10 volts).

In various implementations, such functions (e.g., for maintaining the specified voltage level) may be particularly desirable, in that other components/circuits of the system may be selected/designed to operate based at least in part on the specified voltage level across the field generating coil. For example, the signal levels of certain of the sensing elements (e.g., sensing coils) of the transducer 120 may be affected in different ways by different magnetic fields/ different magnetic flux as resulting from different voltage levels across the field generating coil. In general, when the voltage across the field generating coil is not at the specified level, the operations/functions/results of the other circuits and components (e.g., of the transducer 120 and/or otherwise of the system 100) that are designed and specified for operating in conjunction with the specified voltage across the field generating coil, may behave differently (e.g., some may respond in a linear manner while others may not) thus resulting in different relative outputs, which may affect the performance/measurement accuracy of the system. Thus, the implementation of the control (e.g., by controlling the bias current) to keep the voltage across the field generating coil L1 at the specified voltage level may be particularly advantageous in regard to such issues.

In various implementations, the control of the bias current (e.g., by the controller) may also be utilized for otherwise controlling the differential amplifier (e.g., for changing between an enabled operating state and a disabled state and/or reduced operating state). For example, during a first state of the system 100 (e.g., including when measurement operations are being performed), the field generating coil L1 may be driven by the drive circuit 400 to produce a magnetic field (e.g., with a changing magnetic flux) so that the sensing elements of the transducer 120 will produce position-dependent signals (e.g., as indicating a relative displacement of the elements of the transducer 120), such as may be processed and utilized (e.g., for measurements for control of a moving mechanism, or for determining a relative measurement, such as of a relative position, etc.). During a second state of the system 100 (e.g., including when measurement operations are not being performed), it may not be necessary or desirable to maintain the voltage across the field generating coil L1 at the specified voltage level. For example, it some implementations it may be desirable during the second operating state to disable or otherwise reduce the operations of the drive circuit 400 (e.g., to reduce current/power usage and/or heat generation, etc. of the system 100).

Accordingly, in certain implementations the controller (e.g., controller 110) may be configured to: provide the bias current to the amplifier portion AP to keep the voltage across the first field generating coil L1 at the specified voltage level during a first state (e.g., when the inductive position transducer system 100 is performing measurement operations); and not provide the bias current to the amplifier portion AP to keep the voltage across the first field generating coil L1 at the specified voltage level during a second state (e.g., when the inductive position transducer system 100 is not performing measurement operations). In various alternative implementations, the controller 110 may provide a second signal (e.g., an enable signal) on the signal line 112 (e.g., which may be signal bus line) for enabling or disabling the amplifier portion AP.

In various implementations, the system (e.g., system 100) may include a semiconductor (e.g., silicon) chip on which the drive circuit 400 and/or other portions of the system 100 are fabricated. For example, the utilization of MOS transistors for the amplifier portion AP may enable the amplifier portion AP and the resonant circuit portion RCP to be fabricated as part of an integrated circuit on a single chip. Correspondingly, the single chip and/or integrated circuit may also include additional portions of the system (e.g., as some examples may include one or more of the controller 110, input multiplexer 130, demodulator 140, amplifier and integrator 150, A-to-D converter 160, etc.).

As described herein, the amplifier portion AP may receive and operate based on a power supply voltage (e.g., power supply voltage Vdd), which may be a common power supply voltage (e.g., for some or all of the portions of the system on the single semiconductor chip). As an example, in one implementation the demodulator portion 140 may be included on the same chip as the drive circuit 400, for which the demodulator portion 140 may receive and operate based on the same power supply voltage Vdd as the amplifier portion AP. As one specific numerical example, the power supply voltage Vdd may be equal to 3.3 volts, for which at least part of all of the system 100 (e.g., including the drive circuit 400, demodulator portion 140, etc.) may operate on the same 3.3 volt power supply voltage. Such a configuration is noted to be advantageous (e.g., in terms of simplicity, etc.) as compared to alternative designs which may require an amplifier portion to utilize a different power supply voltage than other portions of the system. As described herein, the drive circuit 400 may be configured to achieve a voltage across the field generating coil L1 that is larger than the power supply voltage Vdd, and in some implementations at least 2 times, or 3 times, as large as the power supply voltage Vdd (e.g., in a configuration where the power supply voltage is 3.3 volts, the voltage that is achieved across the field generating coil L1 may be at least approximately 10 volts, or at least approximately 12 volts, etc.).

It should be appreciated that, in the exemplary implementation of the drive circuit 400 shown in FIG. 4, emphasis has been placed on circuit symmetry, rather than minimizing the number of separate circuit elements in the drive circuit 400. Thus, it should be appreciated that, in various other exemplary implementations of the drive circuit 400, various ones of the capacitors C1, C2, C3, C4 and C5, and various ones of the resistors R1, R2, R3, R4, R5, R6 and R7 may be combined into single circuit elements.

In various implementations, the drive circuit 400 may be implemented in a layout placing it close to the field generating coil L1 to be driven (e.g., to minimize the stray effects of wiring and connections which may otherwise intervene, and to provide more-predictable and stable performance characteristics for the inductive position transducer system, etc.). For example, the drive circuit 400 and its associated field generating coil L1 may be assembled, or directly fabricated, onto a shared member, such as a printed circuit board, or a flex-circuit, or the like.

With respect to the impedance transformer 20, it will be appreciated that by providing both the serially-connected and the parallel-connected capacitors (e.g., parallel-connected capacitor C1 and series-connected capacitors C2 and C3), relative to the field generating coil L1, two degrees of freedom are provided in selecting capacitances for these capacitors. More specifically, in various implementations there are two different degrees of freedom in the impedance transformer 20 (e.g., including the resonant frequency and the input impedance). Thus, the resonant frequency of the impedance transformer 20 can be prescribed or selected independently of the impedance Z of the impedance transformer 20 (e.g., such as in accordance with certain principles as described above with respect to FIG. 3). In various implementations, the impedance transformer 20 may help attenuate and phase-shift frequencies other than the tuned center frequency, so that the closed-loop gain is sufficient for sustained oscillation only at the center frequency.

In certain conventional field generating coil drive circuits, either the resonant frequency or the impedance could be selected, but once either the resonant frequency or the impedance was selected, the impedance or the resonant frequency, respectively, was fixed. Thus, by allowing both the resonant frequency and the impedance to be prescribed or selected independently of each other, the impedance transformer 20 (e.g., which in some instances may also be referred to as a dual or multi capacitor resonator), enables field generating coils to be driven efficiently.

Additionally, the voltage across the field generating coil that can be obtained using the impedance transformer 20 is higher than can be obtained in a single-capacitor resonator. Thus, the resolution of the transducer can be improved. At the same time, because the resonant frequency of the impedance transformer 20 can be tuned, in various implementations a sine wave can be provided tuned to the resonant frequency such that the field generating coil can be driven more efficiently, and the transducer output determined more accurately, than with other distorted waveforms.

Moreover, in various implementations because harmonics may be removed from the drive signal (i.e., as provided to the field generating coil L1), less electromagnetic radiation is radiated to the environment. This may allow the drive circuit to be used in more EMF-sensitive environments, with lower-cost inductive transducer packaging.

It should also be appreciated that, in the drive circuit 400, in various implementations the oscillation frequency of the drive circuit 400 may track any drift of the field generating coil. Thus, the oscillation of the drive circuit 400 may stay on-resonance better than drive circuits that are controlled by an externally-located oscillator circuit. That is, by including the field generating coil inductance into the resonating circuit that sets the resonant frequency of the oscillator, in various implementations the oscillator may produce a maximal drive signal at the precise frequency of the resonator.

Because the tolerances of the component values, such as the capacitance, resistance, and inductance, of the various capacitors, resistors and the field generating coil may vary, the actual resonant frequency of any actual drive circuit built according to the principles discussed above and shown in FIG. 4 may not be exactly at a designed frequency. However, in various implementations the drive circuit 400 may automatically find the oscillation frequency that produces the strongest signal (e.g., as resulting in the strongest output signal from the transducer).

Thus, the oscillating drive circuit as described herein may avoid many problems associated with certain prior art oscillating drive circuits for inductive position transducers. For example, the ringing oscillator disclosed in the incorporated '389 and '387 patents is generally unsuitable for small inductances, such as those associated with compact, high accuracy, inductive position transducers, and furthermore, uses large capacitance capacitors to generate a strong enough signal through the field generating coil of compatible transducers. However, such large capacitance capacitors take a significant time to charge up, thus limiting the sampling frequency obtainable with this ringing circuit. Furthermore, the large-capacitance capacitor must be charged up to the same voltage level for each sample, and the transistor-implemented switch must be able to handle the large current loads flowing from the large-capacitance capacitor through the field generating coil.

In contrast, other conventional continuous drive circuits may inherently create multiple-frequency waveforms, and are often unable to create a pure sine wave. Furthermore, in many such circuits, it is necessary to separate the oscillator from the resonator. Therefore, such multiple-frequency drive circuits, such as those that use crystal oscillators, are sensitive to drifting of the resonator frequency that may occur due to aging or environmental effects in the transducer parameters or in the other circuit elements. It is also harder with such multiple-frequency drive circuits to precisely control the signal that the transducer receives.

It will be appreciated that in various implementations in relation to the operations (e.g., the double-ended oscillator operations) of the drive circuit 400, the net voltage across the field generating coil L1 may be essentially zero. Therefore, there may essentially be no voltage signal that passes through the field generating coil L1. As a result, there may be little or no capacitive coupling in the transducer using the drive circuit 400. In addition, because the double-ended oscillator operations essentially provide twice as much signal strength at the same frequency (e.g., as compared to an implementation with a single-ended oscillator drive circuit), the double-ended oscillator operations of the drive circuit 400 may allow the same signal magnitude to be obtained (e.g., by the synchronous demodulator 140) in essentially half the time. Thus, the double-ended oscillator operations of the drive circuit 400 may have an effectively shorter sampling window.

FIG. 5 is a flow diagram illustrating a method 500 for operating an inductive position transducer system. At a block 510, a drive circuit of an inductive position transducer system is operated to drive a first field generating coil. The drive circuit includes a resonant circuit portion and an amplifier portion (e.g., wherein the resonant circuit portion is connected between the first field generating coil and the amplifier portion). In various implementations, the amplifier portion includes a current-driven single stage differential amplifier (e.g., including MOS transistors fabricated as part of an integrated circuit on a semiconductor chip, such as along with other portions of the inductive position transducer system).

At a block 520, a bias current of the amplifier portion is adjusted to correspondingly adjust a voltage across the first field generating coil. For example, a controller may adjust a bias current as provided to a bias current portion of the amplifier portion to keep a voltage across the first field generating coil at a specified voltage level (e.g., at 10 volts, or 12 volts, etc.). At a block 530, an output is provided based at least in part on a position-dependent signal from the inductive position transducer. For example, an input/output interface and/or other portion(s) of the system (e.g., an A-to-D converter, etc.) may provide an output that represents a displacement of the inductive position transducer. In various implementations, the output may be provided to a downstream device, such as a numerically controlled machine tool, or to a display device to display a position signal or numerical value that represents the displacement of the inductive position transducer, etc.

In various implementations, the operating of the drive circuit of the inductive position transducer system to drive the first field generating coil is performed to keep a voltage across the first field generating coil at a specified voltage level during a first state (e.g., such as when the inductive position transducer system is performing measurement operations). In various implementations, the method may further include reducing the bias current (e.g., to a lower level, such as a zero or a non-zero lower level) during a second state (e.g., such as when the inductive position transducer system is not performing measurement operations), so as to not keep the voltage across the first field generating coil at the specified voltage level during the second state.

As described above with respect to FIGS. 1-5, in accordance with principles as disclosed herein, an impedance transformer 20 is utilized that allows high coil voltages (e.g., across the field generating coil L1) to be achieved. The impedance transformer 20 includes capacitors (e.g., capacitors C1-C3) and a field generating coil (e.g., coil L1) and may be at least part of a resonator portion RP (e.g., which in various implementations may also include filter portions, such as FP1 and FP2, etc.). In various implementations, three capacitors (e.g., capacitors C1-C3) are utilized to make the drive circuit (e.g., drive circuit 400) fully differential. A resistor divider (e.g., including resistors R1-R3) may be utilized to feed the coil voltage (e.g., of the field generating coil L1) back to the differential amplifier DA (e.g., as part of the integrated circuit). The resistor divider may be utilized to ensure that feedback signals do not exceed the power supply voltage (e.g., of the integrated circuit).

In various implementations, resistor-capacitor connections (e.g., including resistor R2 and capacitor C4 in series, and resistor R3 and capacitor C5 in series) create a high pass filter configuration (e.g., as part of a feedback loop configuration) which may be tuned to compensate for phase shift in the differential amplifier DA. In various implementations, in order for a desired oscillation to occur, the feedback loop configuration must generally be in phase with the coil voltage (e.g., of the field generating coil L1) with a gain greater than 1. In various implementations, certain resistance values (e.g., of resistors R4 and R5) are configured to provide correct bias levels (e.g., for the differential amplifier DA), and certain resistance values (e.g., of resistors R6 and R7) are configured to keep terminals (e.g., terminals xlp and xln of the field generating coil L1) from floating (e.g., from having no connection to ground for which the voltages at the terminals may otherwise vary in accordance with charge accumulation, such as when the drive circuit is not being operated to provide the oscillating voltage across the field generating coil, etc.).

It will be appreciated that a drive circuit such as that disclosed herein may enable an inductive position transducer system to be relatively compact and to utilize relatively low power (e.g., for which the drive circuit for the field generating coil and some or all of the read-out electronics may be on the same integrated circuit). More specifically, in various configurations, the drive circuit may be implemented utilizing low-power MOS transistors (e.g., NMOS, PMOS, CMOS transistors) which may be included in an integrated circuit (e.g., on a single semiconductor chip) with some or all of the read-out circuits/electronics (e.g., some or all of a controller 110, multiplexer 130, demodulator 140, amplifier and integrator 150, A-to-D converter 160, memory 170, gate array 180, I/O interface 190, etc.). The drive circuit is able to provide a voltage (e.g., across a field generating coil) which is substantially larger than that of a power supply voltage (e.g., of the drive circuit and/or integrated circuit). In various implementations, the utilization of the MOS transistors in the drive circuit may enable achieving small overall size of the circuit and/or relatively lower power dissipation. The drive circuit may have an electronically adjustable drive level (e.g., as controlled by a bias current). A frequency of the drive circuit may be set by components (e.g., in accordance with the values of the associated capacitors and resistors) in a self-resonant manner (e.g., which may achieve low noise).

It will be appreciated that the principles disclosed and claimed herein may be readily and desirably combined with various features disclosed in the incorporated references. The various implementations described above can be combined to provide further implementations. All of the U.S. patents and U.S. patent applications referred to in this specification are incorporated herein by reference, in their entirety. Aspects of the implementations can be modified, if necessary to employ concepts of the various patents and applications to provide yet further implementations. These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled.

The invention claimed is:

1. An inductive position transducer system, comprising:
an inductive position transducer comprising at least a first field generating coil having a first coil terminal, a second coil terminal and a coil impedance;
a drive circuit configured to drive the first field generating coil, the drive circuit comprising:
a resonant circuit portion connected to the first and second coil terminals, the resonant circuit portion comprising at least a first resonant circuit portion component, a second resonant circuit portion component, and a third resonant circuit portion component, wherein the first resonant circuit portion component is coupled between a first resonant circuit portion node and a second resonant circuit portion node, the first resonant circuit portion node is separated from the first coil terminal by at least the second resonant circuit portion component, and the second resonant circuit portion node is separated from the second coil terminal by at least the third resonant circuit portion component; and
an amplifier portion connected to the first and second resonant circuit portion circuit nodes, the amplifier portion having an output impedance during operation, wherein the amplifier portion is configured to provide an oscillating drive signal at the first and second resonant circuit portion nodes, the amplifier portion comprising a current-driven single stage differential amplifier, the current-driven single stage differential amplifier comprising first and second amplifier inputs and first and second amplifier outputs, with the first amplifier output connected to the first resonant circuit portion node and the second amplifier output connected to the second resonant circuit portion node; and
a controller, wherein the amplifier portion comprises a bias current portion that receives a bias current from the controller, for which the controller is configured to provide the bias current to the amplifier portion to keep a voltage across the first field generating coil at a specified voltage level;
wherein a resonator portion comprising at least the resonant circuit portion and the first field generating coil has a resonant frequency and a load impedance presented to the amplifier portion during operation.

2. The inductive position transducer system of claim 1, wherein the current driven single stage differential amplifier comprises a first single stage amplifier portion and a second single stage amplifier portion.

3. The inductive position transducer system of claim 2, wherein the first and second single stage amplifier portions comprise metal-oxide-semiconductor transistors.

4. The inductive position transducer system of claim 2, wherein the first and second single stage amplifier portions are each complimentary amplifier portions which each comprise a p-channel MOS transistor and an n-channel MOS transistor.

5. The inductive position transducer system of claim 2, wherein:
the first single stage amplifier portion comprises a first n-channel MOS transistor and a first p-channel MOS transistor, with the gates of the first NMOS and PMOS transistors coupled together to provide the first amplifier input and the drains of the first NMOS and PMOS transistors coupled together to provide the second amplifier output; and the second single stage amplifier portion comprises a second NMOS transistor and a second PMOS transistor, with the gates of the second NMOS and PMOS transistors coupled together to provide the second amplifier input and the drains of the second NMOS and PMOS transistors coupled together to provide the first amplifier output.

6. The inductive position transducer system of claim 1, wherein the bias current portion comprises two MOS transistors which form a current mirror.

7. The inductive position transducer system of claim 1, wherein the controller is configured to adjust the bias current that is provided to the amplifier portion to maintain the voltage across the first field generating coil at a specified voltage level, such that:

at a first time, the controller is configured to provide the bias current at a first bias current level which results in a voltage across the field generating coil that is at the specified voltage level; and at a second time, the controller providing the bias current at the first bias current level results in a voltage across the field generating coil that is not at the specified voltage level, for which the controller is configured to adjust the bias current from the first bias current level to a second bias current level which results in a voltage across the field generating coil that is at the specified voltage level.

8. The inductive position transducer system of claim 1, wherein the controller is configured to:

provide the bias current to the amplifier portion to keep the voltage across the first field generating coil at the specified voltage level during a first state when the inductive position transducer system is performing measurement operations; and not provide the bias current to the amplifier portion to keep the voltage across the first field generating coil at the specified voltage level during a second state when the inductive position transducer system is not performing measurement operations.

9. The inductive position transducer system of claim 1, comprising a semiconductor chip on which both the amplifier portion and the resonant circuit portion are included as part of an integrated circuit.

10. The inductive position transducer system of claim 9, wherein the current-driven single stage differential amplifier of the amplifier portion comprises metal oxide semiconductor transistors.

11. The inductive position transducer system of claim 1, wherein the amplifier portion receives and operates based on a power supply voltage.

12. The inductive position transducer system of claim 11, further comprising a demodulator portion, wherein the demodulator portion receives and operates based on the same power supply voltage as the amplifier portion.

13. The inductive position transducer system of claim 11, wherein an impedance transformer portion comprises the resonant circuit portion, and through utilization of the current-driven single stage differential amplifier and the impedance transformer portion the drive circuit is configured to produce a voltage across the field generating coil that is larger than the power supply voltage.

14. The inductive position transducer system of claim 1, wherein the drive circuit further comprises:

a first filter portion connected to the first coil terminal and the first amplifier input of the current-driven single stage differential amplifier; and a second filter portion connected to the second coil terminal and the second amplifier input of the current-driven single stage differential amplifier.

15. The inductive position transducer system of claim 14, wherein:

the first filter portion comprises a first filter portion capacitor and a first filter portion resistor which are coupled in series between the first coil terminal and the first amplifier input; and the second filter portion comprises a second filter portion capacitor and a second filter portion resistor which are coupled in series between the second coil terminal and the second amplifier input.

16. The inductive position transducer system of claim 14, wherein:

the first filter portion comprises a respective first filter portion first node connected to the first coil terminal, and a first filter portion second node, and the second filter portion comprises a second filter portion first node connected to the second coil terminal, and a second filter portion second node;

the first amplifier output of the differential amplifier is connected to the first resonant circuit portion node and to a first terminal of a first bias resistor;

the second amplifier input of the differential amplifier is connected to a second terminal of the first bias resistor;

the first amplifier input of the differential amplifier is connected to the respective first filter portion second node;

the second amplifier output of the differential amplifier is connected to the second resonant circuit portion node and to a first terminal of a second bias resistor;

the first amplifier input of the differential amplifier is connected to a second terminal of the second bias resistor; and the second amplifier input of the differential amplifier is connected to the respective second filter portion second node.

17. The inductive position transducer system of claim 16, wherein:

the first filter portion comprises at least one first filter portion capacitor having a respective first terminal connected to the first coil terminal, and a respective second terminal connected to a first terminal of at least one respective first filter portion resistor; and the second filter portion comprises at least one respective second filter portion capacitor having a respective first terminal connected to the second coil terminal, and a respective second terminal connected to a first terminal of at least one respective second filter portion resistor.

18. The inductive position transducer system of claim 17, wherein:

a second terminal of the at least one respective first filter portion resistor is connected to the first amplifier input; and a second terminal of the at least one respective second filter portion resistor is connected to the second amplifier input.

19. The inductive position transducer system of claim 18, wherein:

the first resonant circuit portion component comprises a first resonant circuit capacitor which is connected between the first and second resonant circuit portion nodes; and the second resonant circuit portion component comprises a second resonant circuit capacitor which has a respective first terminal connected to the first resonant circuit portion node, and a respective second terminal connected to the first coil terminal; and the third resonant circuit portion component comprises a third resonant circuit capacitor which has a respective first terminal connected to the second resonant circuit portion node, and a respective second terminal connected to the second coil terminal.

20. A method of operating an inductive position transducer system which includes an inductive position transducer comprising at least a first field generating coil having a first coil terminal, a second coil terminal and a coil impedance, the method comprising:

operating a drive circuit of the inductive position transducer system to drive the first field generating coil, the drive circuit comprising:

a resonant circuit portion connected to the first and second coil terminals, the resonant circuit portion comprising at least a first resonant circuit portion component, a second resonant circuit portion component, and a third resonant circuit portion component, wherein the first resonant circuit portion component is coupled between a first resonant circuit portion node and a second resonant circuit portion node, the first resonant circuit portion node is separated from the first coil terminal by at least the second resonant circuit portion component, and the second resonant circuit portion node is separated from the second coil terminal by at least the third resonant circuit portion component; and an amplifier portion connected to the first and second resonant circuit portion circuit nodes, the amplifier portion having an output impedance during operation, wherein the amplifier portion is configured to provide an oscillating drive signal at the first and second resonant circuit portion nodes, the amplifier portion comprising a current-driven single stage differential amplifier, the current-driven single stage differential amplifier comprising first and second amplifier inputs and first and second amplifier outputs, with the first amplifier output connected to the first resonant circuit portion node and the second amplifier output connected to the second resonant circuit portion node;

wherein a resonator portion comprising at least the resonant circuit portion and the first field generating coil has a resonant frequency and a load impedance presented to the amplifier portion during operation;

adjusting a bias current of the current-driven single stage differential amplifier to correspondingly adjust a voltage across the first field generating coil; and providing an output based at least in part on a position-dependent signal from the inductive position transducer.

21. The method of claim 20, wherein the operating of the drive circuit of the inductive position transducer system to drive the first field generating coil is performed to keep the voltage across the first field generating coil at a specified voltage level during a first state when the inductive position transducer system is performing measurement operations, and the method further comprises:

reducing the bias current during a second state when the inductive position transducer system is not performing measurement operations, so as to not keep the voltage across the first field generating coil at the specified voltage level during the second state.

22. A drive circuit for utilization as part of an inductive position transducer system which includes an inductive position transducer comprising at least a first field generating coil having a first coil terminal, a second coil terminal and a coil impedance, the drive circuit comprising:

a resonant circuit portion configured to be connected to the first and second coil terminals, the resonant circuit portion comprising at least a first resonant circuit portion component, a second resonant circuit portion component, and a third resonant circuit portion component, wherein the first resonant circuit portion component is coupled between a first resonant circuit portion node and a second resonant circuit portion node, the first resonant circuit portion node is separated from the first coil terminal by at least the second resonant circuit portion component, and the second resonant circuit portion node is separated from the second coil terminal by at least the third resonant circuit portion component; and an amplifier portion connected to the first and second resonant circuit portion circuit nodes, the amplifier portion having an output impedance during operation, wherein the amplifier portion is configured to provide an oscillating drive signal at the first and second resonant circuit portion nodes, the amplifier portion comprising a current-driven single stage differential amplifier, the current-driven single stage differential amplifier comprising first and second amplifier inputs and first and second amplifier outputs, with the first amplifier output connected to the first resonant circuit portion node and the second amplifier output connected to the second resonant circuit portion node, wherein the current-driven single stage differential amplifier has a bias current that is configured to be adjusted to correspondingly adjust a voltage across the first field generating coil;

wherein a resonator portion comprising at least the resonant circuit portion and the first field generating coil has a resonant frequency and a load impedance presented to the amplifier portion during operation.

23. The drive circuit of claim 22, wherein the current-driven single stage differential amplifier comprises metal oxide semiconductor transistors.

24. The drive circuit of claim 22, further comprising:

a first filter portion connected to the first coil terminal and the first amplifier input of the current-driven single stage differential amplifier; and a second filter portion connected to the second coil terminal and the second amplifier input of the current-driven single stage differential amplifier.

25. The drive circuit of claim 24, wherein:

the first filter portion comprises a first filter portion capacitor and a first filter portion resistor which are coupled in series between the first coil terminal and the first amplifier input; and the second filter portion comprises a second filter portion capacitor and a second filter portion resistor which are coupled in series between the second coil terminal and the second amplifier input.

* * * * *